United States Patent [19]

Krafthefer et al.

[11] 4,150,863

[45] Apr. 24, 1979

[54] CIRCUIT BOARD CONNECTOR AND MEANS OF MOUNTING SAME

[75] Inventors: Kerry M. Krafthefer, Naperville; John M. Stipanuk, Glen Ellyn, both of Ill.

[73] Assignee: Molex Incorporated, Lisle, Ill.

[21] Appl. No.: 862,949

[22] Filed: Dec. 21, 1977

Related U.S. Application Data

[63] Continuation of Ser. No. 756,793, Jan. 5, 1977, abandoned.

[51] Int. Cl.$^2$ ........................ H01R 13/12; H05K 1/18

[52] U.S. Cl. ........................... 339/17 LC; 339/192 R; 339/258 P

[58] Field of Search .............. 339/17 R, 17 L, 17 LC, 339/17 C, 17 CF, 91 R, 176 M, 256 R, 258 R, 258 P, 75 M, 75 MP, 192 R

[56] References Cited

U.S. PATENT DOCUMENTS

| | | | |
|---|---|---|---|
| 3,548,361 | 12/1970 | Garrett et al. | 339/17 R |
| 3,706,954 | 12/1972 | Krafthefer | 339/17 L |

FOREIGN PATENT DOCUMENTS

| | | | |
|---|---|---|---|
| 710404 | 6/1954 | United Kingdom | 339/256 R |
| 1143347 | 2/1969 | United Kingdom | 339/17 C |

*Primary Examiner*—Neil Abrams
*Attorney, Agent, or Firm*—Louis A. Hecht

[57] ABSTRACT

A connector assembly for electrically connecting an elongated pin conductor with a second circuit member. The connector assembly generally includes an insulated housing having a terminal receiving recess formed therein. The recess has a top wall, a bottom wall, a first end with an opening through which the pin conductor is received into the recess and a second end opposite the first end through which a terminal is inserted. The connector assembly also includes an electrical terminal received in the recess. The terminal has a lead portion connectable with said second circuit member and a resilient loop-shaped portion for engaging the bottom of the pin conductor when the pin is inserted into the terminal receiving recess. The terminal also includes a pair of spring fingers formed on top of the loop-shaped portion for laterally engaging the pin conductor when inserted into the terminal receiving recess. The above connector assembly is mountable on a circuit board between an edge thereof and a terminal opening spaced from the edge. Toward this end there is provided a generally rigid L-shaped ledge formed on the bottom of the first end of the housing to define with the housing an edge receiving recess for receiving the edge of the circuit board.

4 Claims, 6 Drawing Figures

CIRCUIT BOARD CONNECTOR AND MEANS OF MOUNTING SAME

This is a continuation of application Ser. No. 756,793 filed Jan. 5, 1977 now abandoned.

BACKGROUND OF THE INVENTION

1. Field of the Invention

The present invention relates to a connector assembly adapted to be mounted on a circuit board and the means of mounting same.

2. Brief Description of the Prior Art

Connector assemblies of the type which electrically connect an elongated pin conductor with another circuit member are well known in the art. A connector assembly of this type includes a housing with a electrical terminal mounted therein to engage the elongated pin when the pin is inserted into the housing. In order to insure good electrical contact between the terminal of the connector assembly and the pin conductor, it is desirable to apply a large amount of terminal force against the pin conductor when the pin conductor is inserted into the housing. An example of this type of connector assembly is disclosed in U.S. Pat. No. 3,697,926 which is assigned to the assignee of the present invention. U.S. Pat. No. 3,697,926 more particularly discloses a loop-shaped terminal which is initially compressed against the walls of the terminal receiving recess prior to the insertion of any pin conductor. Accordingly, when a pin conductor is inserted into the housing, the terminal which is already under compression is further compressed thereby producing a relatively large amount of force over a small area to insure electrical contact. Although this design has proven successful in general, the electrical interface produced may not be satisfactory for all kinds of applications.

Connector assemblies of the type above described are often mounted on a board member, such as a printed circuit board, and then subsequently soldered thereon. It has been proven desirable to have some initial mounting means associated between the connector assembly and the printed circuit board to hold the connector assembly in place prior to and during the soldering operation.

An example of one means to mount a connector assembly onto a printed circuit board prepatory to soldering is disclosed in U.S. Pat. No. 3,706,954 which has been assigned to the assignee of the present invention. In that patent, the housing includes a ledge formed thereon which is adapted to engage the edge of the printed circuit board. Simultaneously, the lead portions of the terminals of the connector assembly are inserted through openings formed in the printed circuit board. This design has not proven universally successful in that there may be a sufficient amount of lateral movement of the connector assembly over the board to cause the connector assembly to dismount itself during the handling of the board prior to the soldering operation.

SUMMARY OF THE INVENTION

It is therefore one object of the present invention to provide a connector assembly which ensures a more reliable electrical contact between an elongated pin conductor and a connector assembly of the type described. This object is accomplished by one embodiment of the present invention currently contemplated which provides an insulated housing including a terminal receiving recess formed therein. The recess has top wall means, a bottom wall, a first end with an opening through which the pin conductor is received into the recess and a second end opposite the first end through which a terminal is inserted. The connector assembly also includes an electrical terminal received in the recess. The terminal includes a means connectable with said second circuit member and a resilient loop-shaped portion for engaging the bottom of the pin conductor when it is inserted into the housing. The loop-shaped portion has a transverse dimension that is greater than the distance between the top wall means and the bottom wall so that the loop-shaped portion is partially flattened by the top wall means upon insertion into the recess and is flattened more when the pin conductor is subsequently inserted into the recess. The terminal further includes receptable means formed on top of the loop-shaped portion for laterally engaging the pin conductor when inserted in the recess.

Another object of the present invention is to provide a new and improved means of mounting a connector assembly on a circuit board between an edge thereof and a terminal opening spaced from the edge. This object is accomplished by one embodiment currently contemplated which provides for an insulated housing including a terminal receiving recess formed therein. The housing has a first end adapted to generally overlie the board edge and the second end adapted to generally overlie the terminal opening. A generally rigid L-shaped ledge is formed on the bottom of the first end of the housing to define with said housing an edge receiving recess for receiving the edge of the circuit board. The ledge has cam means formed thereon which is adapted to engage the top of the edge prior to its being received in the edge receiving recess. An electrical terminal is received in the terminal receiving recess. The terminal includes a deformable lead portion extending out of the second end of the housing which is disposed generally downwardly and canted toward the first end and adapted to be received through the terminal opening. The distance between the end of the lead portion and the cam means is less than the distance between the board edge and the terminal opening so that when the lead portion is initially inserted into the terminal opening, the cam means will engage the board edge. A downward force applied to the first end of the housing will cause the lead portion to deform allowing the ledge to snap over the edge so that it will be received within the edge receiving recess.

DESCRIPTION OF THE PREFERRED EMBODIMENT

Figure 1:
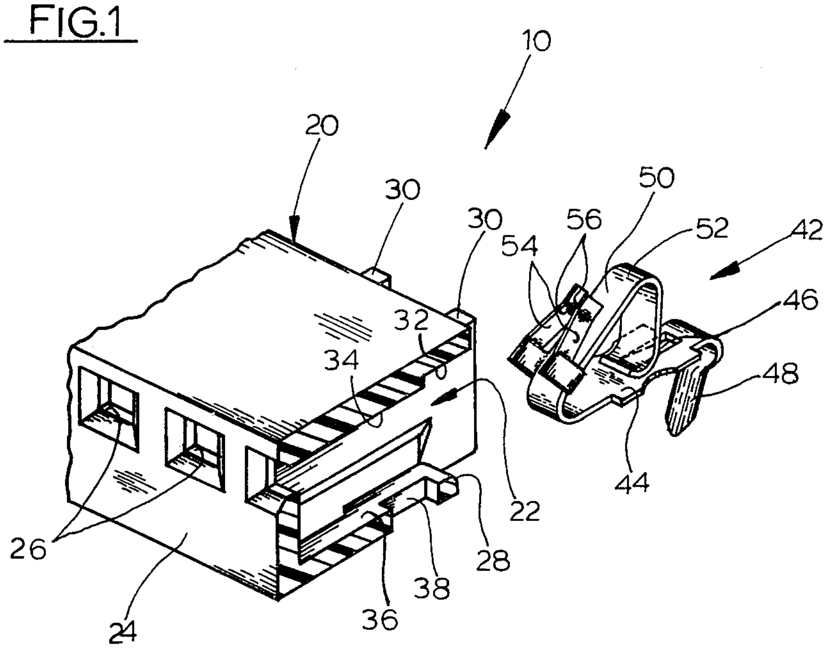
FIG. 1 is a sectioned, fragmentary perspective view of the housing and a perspective view of the terminal both of which comprise the connector assembly of the present invention.

Turning now to the drawings in greater detail, the connector assembly of the present invention, generally designated 10, is adapted to be mounted on a printed circuit board 12. The purpose of the connector assembly 10 is to electrically connect an elongated pin conductor 14 with printed circuitry 16 formed on the printed circuit board 12.

Figure 2:
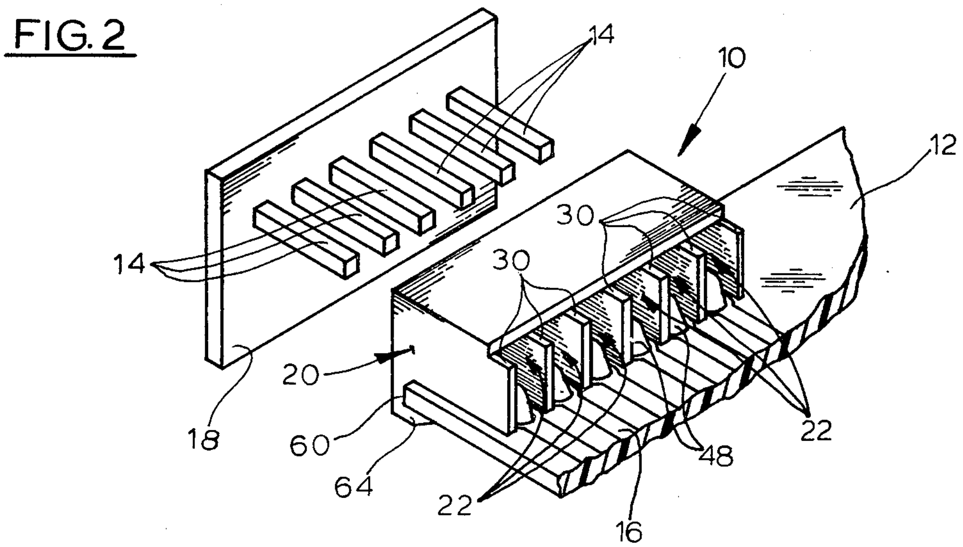
FIG. 2 is a perspective view of the connector assembly of the present invention mounted on a circuit member showing a plurality of pin conductors prior to insertion into the connector assembly.
Figure 5:
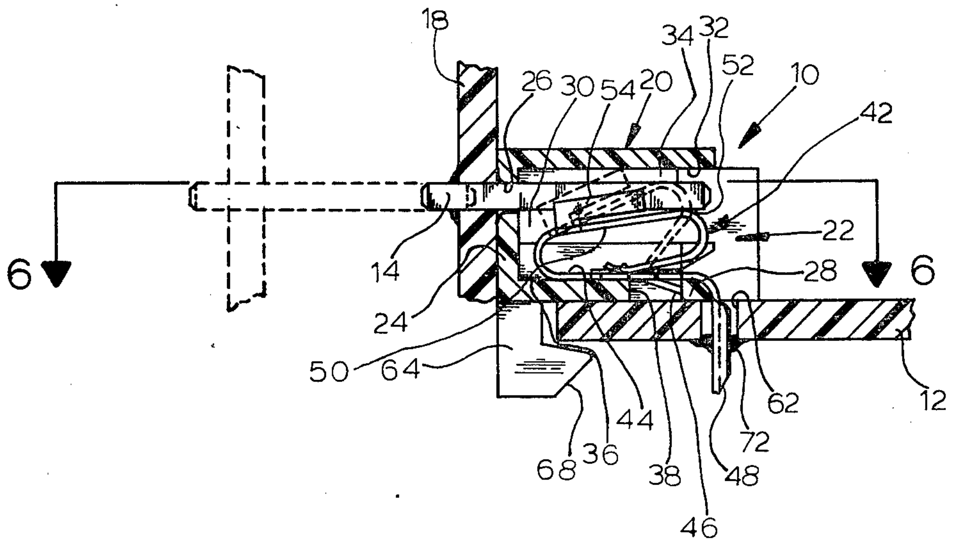
FIG. 5 is a side section view of the connector assembly of the present invention mounted on a circuit board member having a pin conductor inserted therein taken through a terminal receiving recess thereof.
Figure 6:
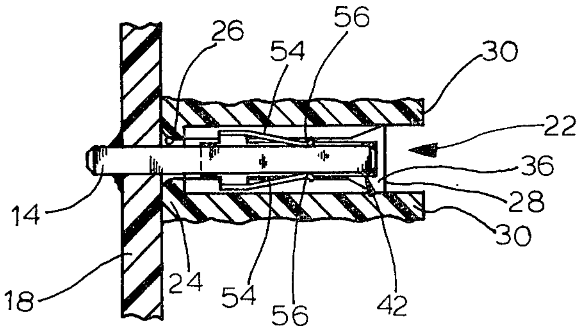
FIG. 6 is a fragmentary section view taken generally along the line 6—6 of FIG. 5.

In FIGS. 2, 5 and 6, a plurality of pin conductors 14 are shown mounted on a pin support member 18. It is understood, however, that the pin conductors 14 can be mounted in anyone of a variety of means well known in the art.

The connector assembly 10 is seen to generally include a housing, generally designated 20, made of insulating material and having a plurality of terminal receiving recesses, generally designated 22. The terminal receiving recesses 22 extend between a first end 24 of the housing 20 wherein the pin conductor 14 is receivable through a pin receiving opening 26 formed therein and a second end 28 of the housing 24.

The respective terminal receiving recesses 22 are divided by a plurality of adjacent vertical sidewalls 30. Each terminal receiving recess 22 has a top wall 32 with an elongated depending ridge 34 formed thereon. Opposite the top wall 32 is a bottom wall 36 having a slot 38 formed therein.

The connector assembly 10 also includes a plurality of electrical metal terminals, each generally designated 42, one for each terminal receiving recess 22. Each terminal 42 has a base portion 44 having a locking tang 46 struck therefrom. From one end of the base portion of 44 extends a lead portion 48 which is eventually adapted to electrically contact the printed circuitry 16. A resilient loop-shaped portion extends from the other end of the base portion 44 and has a contact point 52 defined the top thereof which is adapted to engage the underside of a pin conductor 14.

In order to better ensure a good electrical contact with the pin conductor 14, each terminal 42 is provided with a pin receptacle means formed on top of the loop-shaped portion 50. More particularly, in the receptacle means is seen to generally include a pair of spring fingers 54 which converge toward one another to define a contact point 56 which is adapted to engage the sides of the pin conductor 14.

Figure 3:
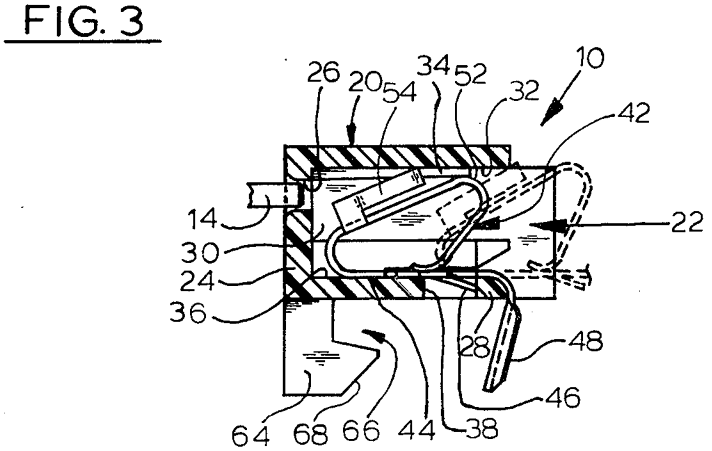
FIG. 3 is a side sectional view of the connector assembly of the present invention taken through a terminal receiving recess thereof and showing a fragmentary portion of a pin conductor prior to insertion into said terminal receiving cavity and also showing the terminal of the connector assembly in phantom immediately prior to its insertion into the terminal receiving recess.

In use, each terminal 42 is inserted into its respective terminal receiving recess 22 from the second end 28 of the housing 20 as is best shown in FIG. 3. It is to be noted, looking at FIG. 3, that the transverse dimension or height of the loopshaped portion 50 shown in phantom is greater than the distance between the bottom wall 36 and the depending ridge 34 within the terminal receiving recess 22. Thus, when the terminal 42 is inserted into the terminal receiving recess 22 the loop-shaped portion 50 is flattened or compressed between the bottom wall and the depending ridge 34. The full insertion of the terminal 42 causes the locking tang 46 to engage slot 38 to prevent withdrawal of the terminal.

When the pin conductor 14 is inserted into a terminal receiving recess 22 through opening 26 as best shown in FIGS. 5 and 6, the loop-shaped portion 50 of each terminal 42 is further compressed or flattened. At the sametime, the pin conductor 14 is received between spring fingers 54. Thus, looking at FIGS. 5 and 6, a conductor pin 14, is captured between the loop-shaped portion 50, the pair of spring fingers 54 and the ridge 34 depending from top wall 32. More particularly, the terminal 42 engages conductor pin 14 at three points, namely, point 52 on the loop-shaped portion 50 and points 56 on the spring fingers 54. Because of the relatively large upward force generated by the loop-shaped portion 50 and the latteral restraint provided by spring fingers 54, the conductor pin 14 is securely held within the terminal receiving recess 22 in a good electrical interface with terminal 42.

The connector assembly 10 as described above is adapted to be mounted on the printed circuit board 12 between an edge 60 thereof and terminal openings 62 spaced from the edge. To this end, there is provided a generally rigid L-shaped ledge 64 formed on the bottom of the first end 24 of the housing 22 to define with the housing an edge receiving recess, generally designated 66, for receiving the edge 60 of the printed circuit board 12 therein. The ledge 64 has an inclined surface 68 defining guiding or cam means. Surface 68 is adapted to engage to top of the edge 60 prior to its being received in the edge receiving recess 66.

Figure 4:
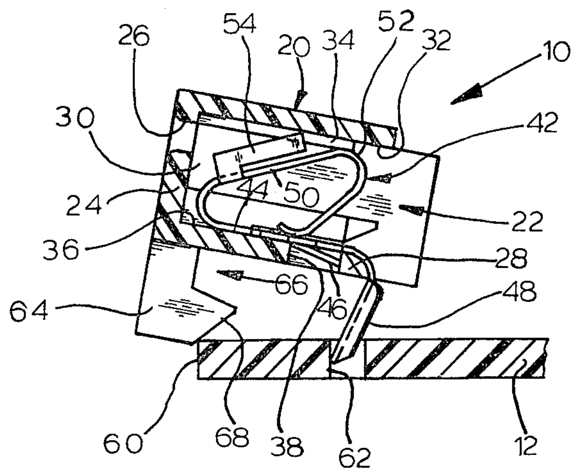
FIG. 4 is a side section view of the connector assembly of the present invention immediately prior to mounting on a circuit board.

The lead portion 48 of each terminal 42 extends out of the second end 28 of the housing 22 and is disposed generally downwardly and canted toward the first end 24 and is adapted to be received through its respective terminal opening 62. The distance between the lead portion 48 and the cam surface 68 is less than the distance between the board edge 60 and terminal opening 62 so that when the lead portion is initially inserted into the terminal opening, the cam surface 68 will engage the board edge 60 as is best shown in FIG. 4.

When a downward force is applied to the first end 24 of housing 20, the lead portion 48 deforms somewhat allowing the cam surface 68 to pass over edge 60 allowing the ledge 64 to snap over the edge so that it will be received within the edge receiving recess 66 as shown in FIG. 5. After this occurs, the connector assembly 10 is firmly mounted on the printed circuit board 12 between the ledge 64 and lead portion 48, both of which engage the board. The connector assembly 10 and printed circuit board 12 are now ready for the soldering operation which will apply solder 72 to the bottom of the board thereby electrically connecting the lead portion 48 to the printed circuitry 16.

We claim:

1. A connector assembly for electrically connecting an elongated pin conductor with a second circuit member, said connector assembly comprising:

an insulated housing including a terminal receiving recess formed therein, said recess having a top wall means, a bottom wall, a first end with an opening through which said pin conductor is received into the recess and a second end opposite the first end through which a terminal is inserted; and an electrical terminal received in said recess, said terminal including means connectable with said second circuit member and a resilient loop-shaped portion for engaging the bottom of the pin conductor when inserted into the terminal receiving recess, said loop-shaped portion having a transverse dimension that is greater than the distance between the top wall means and bottom wall so that the loop-shaped portion is partially flattened by the top wall means upon insertion into the recess, and is flattened more when said pin conductor is subsequently inserted into the recess, said terminal further including receptacle means formed on said loop-shaped portion for laterally engaging said pin conductor when inserted into the recess.

2. The connector assembly of claim 1 wherein said receptacle means includes a pair of spring fingers formed on top of extending from either side of the loop-shaped portion to form a three-sided receptacle.

3. The connector assembly of claim 1 including cooperating means on said housing and terminal for retaining said terminal in the recess, said cooperating means including a slot formed in the bottom wall of the recess and a locking tang formed on the bottom of the terminal adapted to engage said slot after insertion to prevent withdrawal.

4. A connector assembly which is mountable on a circuit board between an edge thereof and a terminal opening spaced from said edge, said connector assembly comprising:

an insulated housing including a terminal receiving recess formed therein and having a first end adapted to generally overlie said board edge and a second end adapted to generally overlie said terminal opening:

a generally rigid L-shaped ledge formed on the bottom of the first end of the housing to define with said housing an edge receiving recess for receiving the edge of the circuit board, said ledge having an inclined surface formed thereon; and an electrical terminal received in the terminal receiving recess, said terminal including a deformable lead portion extending out of the second end of the housing which is disposed generally downwardly and canted toward the first end adapted to be received through said terminal opening, the distance between the end of the lead portion and the inclined surface being less than the distance between the board edge and terminal opening so that when the lead portion is initially inserted into said terminal opening the inclined surface will initially engage the top of said board edge, whereby a downward force applied to the first end of the housing will cause the lead portion to deform allowing the inclined surface to slide against the edge until the ledge snaps thereover so that the board edge will be received within the edge receiving recess.

* * * * *